United States Patent
Dietz et al.

(10) Patent No.: US 11,488,766 B2
(45) Date of Patent: Nov. 1, 2022

(54) GRADIENT COIL AND METHOD FOR THE PRODUCTION OF A GRADIENT COIL

(71) Applicant: Siemens Healthcare GmbH, Erlangen (DE)

(72) Inventors: Peter Dietz, Fuerth (DE); Lothar Schoen, Neunkirchen (DE); Stefan Stocker, Grossenseebach (DE)

(73) Assignee: Siemens Healthcare GmbH, Erlangen (DE)

( * ) Notice: Subject to any disclaimer, the term of this patent is extended or adjusted under 35 U.S.C. 154(b) by 599 days.

(21) Appl. No.: 16/528,035

(22) Filed: Jul. 31, 2019

(65) Prior Publication Data

US 2020/0043649 A1 Feb. 6, 2020

(30) Foreign Application Priority Data

Jul. 31, 2018 (DE) .......................... 102018212757.3

(51) Int. Cl.
*G01V 3/00* (2006.01)
*H01F 27/28* (2006.01)
*H01F 41/04* (2006.01)
*H01F 27/32* (2006.01)
*G01R 33/385* (2006.01)

(52) U.S. Cl.
CPC ....... *H01F 27/2876* (2013.01); *G01R 33/385* (2013.01); *G01R 33/3856* (2013.01); *H01F 27/32* (2013.01); *H01F 41/04* (2013.01)

(58) Field of Classification Search
CPC .............. G01R 33/3415; G01R 33/543; G01R 33/5659; G01R 33/36; A61B 5/055
USPC .......................................................... 324/309
See application file for complete search history.

(56) References Cited

U.S. PATENT DOCUMENTS

| | | | |
|---|---|---|---|
| 6,111,412 A | 8/2000 | Boemmel et al. | |
| 2007/0247156 A1* | 10/2007 | Schuster | G01R 33/3856 324/318 |
| 2009/0086435 A1* | 4/2009 | Suzuki | H01L 23/473 361/704 |
| 2014/0120243 A1* | 5/2014 | Laine | C08G 77/08 427/58 |
| 2014/0276704 A1* | 9/2014 | McKay | A61B 18/02 606/21 |

FOREIGN PATENT DOCUMENTS

| | | | | |
|---|---|---|---|---|
| CN | 106660313 A | * | 5/2017 | ............. B32B 33/00 |
| CN | 107438515 A | * | 12/2017 | ........... G03H 1/0248 |
| DE | 4317807 C1 | * | 8/1994 | ............. F02K 1/822 |
| DE | 19721985 A1 | | 12/1998 | |
| DE | 102006014305 A1 | | 10/2007 | |
| JP | 2001335096 A | * | 12/2001 | |

OTHER PUBLICATIONS

Wikipedia: "Polyethylen"; abgerufen am Aug. 5, 2019.

* cited by examiner

*Primary Examiner* — Walter L Lindsay, Jr.
*Assistant Examiner* — Frederick Wenderoth
(74) *Attorney, Agent, or Firm* — Banner & Witcoff Ltd.

(57) ABSTRACT

A gradient coil having a coil body made from a cured casting compound and at least one cooler embedded in the casting compound, serving to conduct a fluid coolant, wherein the cooler and the casting compound do not adhere to each other.

16 Claims, 3 Drawing Sheets

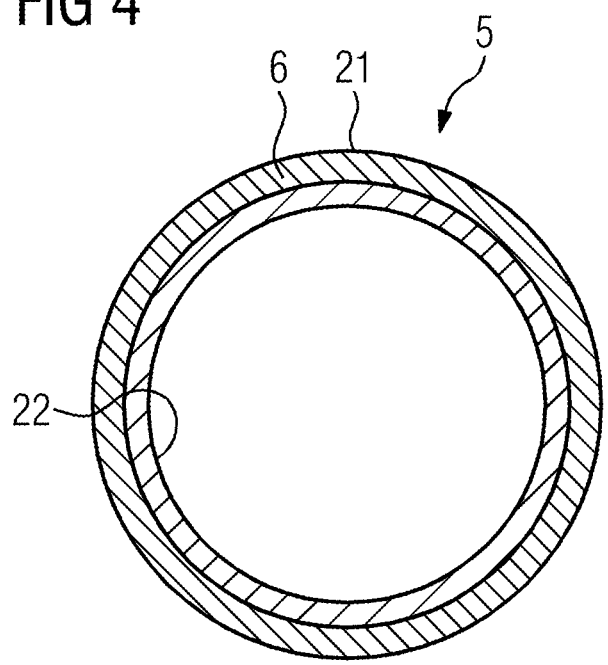

GRADIENT COIL AND METHOD FOR THE PRODUCTION OF A GRADIENT COIL

BACKGROUND

The invention relates to a gradient coil, comprising a coil body made from a cured casting compound and at least one cooling device embedded in the casting compound, serving to conduct a fluid coolant.

Gradient coils of this kind are used in magnetic resonance tomographs and are used for spatial encoding of the magnetic resonance signal in the space. For this purpose, a plurality of electric coils is conventionally cast in the coil body, which is composed of a cured casting compound, which coils, as a rule, are arranged in a plurality of layers on a cylinder surface. One or more cooling devices are embedded between the layers of the coils, which make it possible to conduct a coolant through the coil body in order to be able to dissipate the considerable amount of heat that accumulates during operation as lost heat from the coil system and to keep the temperature below a critical value. Such a cooling device can be integrated either in the form of one or more cooling hoses installed in a correspondingly meandering manner or with a different geometry, or as flat cooling mats.

Gradient coils are subject to high loads during operation due to the given electro-magnetic influences. Due to these loads, smaller or larger cracks can form in the casting compound over time. These cracks do not usually constitute an obstacle to high-quality and safe operation of the gradient coil. However, if a crack in the casting compound also extends through the wall of a cooling device embedded in the casting compound, be it a cooling hose or a cooling mat, then this leads to a leak and therewith to a defect of the gradient coil requiring replacement. Since the loads of the gradient coil due to vibrations, Lorentz forces and thermal heating cycles, which are the cause of the occurrence of the cracks, can hardly be sufficiently reduced, there is a great need for an improved gradient coil in which, despite the load-related occurrence of cracks, there is no concern about crack growth through a cooling device wall and therewith damage to the cooling device.

SUMMARY

The object of the invention is therefore to disclose a gradient coil that is improved by comparison.

To achieve this object, in a gradient coil of the type mentioned in the introduction it is inventively provided that the cooling device and the casting compound do not adhere to each other.

The inventive gradient coil is characterized by a corresponding choice of material for the cooling device and the casting compound in such a way that these do not adhere to each other during the casting, do not enter into an adhesive bond with each other therefore. The cooling device is securely and firmly embedded in the casting compound, so the thermal resistance between the casting compound and the cooling device is as small as possible and a high heat transfer rate is possible. However, as a result of the non-existent adhesive bond, since they do not adhere to each other, a microscopically small gap is formed between the cooling device and the casting compound, that is to say that due to this minimal gap, there is no permanent connection between the casting compound and the cooling device. This then particularly advantageously means that cracks which spread through the casting compound are not able to also spread in the cooling device wall material because, as a result of the fact that the cooling device and the casting compound do not adhere to each other, the stresses leading to cracking within the casting material are not passed on to the cooling device or the cooling device material. The gap therefore forms a microscopic parting plane around the cooling device, a possible crack formation is deflected or conducted around the cooling device. Nevertheless, embedding still occurs and, despite the microscopic gap, there is sufficiently good thermal contact between the cooling device and the casting compound. This is especially the case because during operation the cooling device rests on the casting, the gap therefore being bridged, owing to the fact that the materials expand slightly or the cooling device is under sufficiently high pressure, owing to the fluid pressure, and expands slightly.

Therefore the inventive gradient coil is, owing to the inventively provided embodiment such that the two central elements, namely casting compound and cooling device, do not, as previously usual in the prior art, firmly adhere to each other, a gradient coil that is much improved in respect of long-term operational reliability.

As described, the main focus is on the corresponding choice of material of casting compound and cooling device material such that neither enter into an adhesive bond with each other. The casting compound in this context is expediently composed of an epoxy resin optionally containing at least one filler such as quartz powder, with an acid anhydride as a hardener component, while the cooling device, at least in the region of its non-adhesive exterior, is composed of a fluorine-containing plastic, in particular PTFE (polytetrafluoroethylene), PVDF (polyvinylidene fluoride) or PFA (perfluoroalkyl polymer) or a silicone or PE (polyethylene) or PP (polypropylene). The disclosed casting material is a conventional casting material as is used for the production of gradient coils. What is novel, however, is the corresponding choice of material for the cooling device, which until now was composed mostly of an elastomer-modified polyamide 12 or a polymer based on polyamide 11. Polybutylene terephthalate or a polymer blend of polybutylene terephthalate and polycarbonate or polyphenylene oxide has also been used previously. However, all these materials together with the casting compound lead to an extremely firmly adhesive bond between cooling device and casting compound, which, in the case of loading, leads to the disadvantages described in the introduction.

Not, however, if the inventive material combinations of epoxy resin casting compound and one of the above-described fluorine-containing plastics such as PTFE, PVDF or PFA or a silicone or PE or PP is used, because these plastics either contain fluorine or silicone, which prevents adhesion, or in the case of polyethylene or polypropylene cannot be wetted by the casting compound.

As an alternative to the use of a plastic as a material for the cooling device, a cooling device made from metal can also be used. Copper, brass or aluminum are suitable. Therefore, according to this variant, pipes of any cross-section (for example, round, oval, rectangular or square) made from metal are used. The casting compound does not enter into an adhesive bond with these metals either, so the inventive advantages result here too.

The cooling device itself can be composed of only one layer of material. Therefore, if one or correspondingly more cooling hoses are installed as a cooling device, the hoses can be composed, for example, of PTFE or PVDF or one of the other said materials. Alternatively, however, it is also conceivable to use a cooling device composed of two or more layers, with the outer layer forming a non-adhesive outer layer. Therefore, in this case, two- or multi-layer cooling hoses or cooling mats are used, wherein the layer structure can be configured accordingly in respect of the given requirements. The outer layer, which is embedded directly in the casting compound, forms a non-adhesive outer layer and is composed of one of said materials, which rule out an adhesive bond with the epoxy resin. The inner layer, on the other hand, can be specifically selected with regard to its physical or chemical properties, for example, such that it has the highest possible resistance in respect of the coolant like the most commonly used water/glycol mixture. If a third layer is used, this can be an intermediate layer between the outer layer and the inner layer, which provides, for example, corresponding elastomeric properties or a good thermal coupling of the inner and outer layers with each other, etc.

Even in the case of a metal cooling device, a multi-layer construction is conceivable. Therefore, it is possible to use the metal pipe as an outer pipe, which is covered on the inside with a plastic layer, which is designed in its properties with respect to the properties of the coolant used. Alternatively, it is also conceivable to use the metal pipe as an inner pipe and to cover it with a plastic layer on the outside. In this case the outer layer accordingly provides the non-adhesive property, while the inner metal pipe is designed in respect of the cooling medium.

If a two- or multi-layer cooling device made from different plastic layers is used, this is preferably implemented in the form of a co-extruded plastic component, for example as a co-extruded cooling hose or in the form of co-extruded film therefore, with two layers of film being brought together to form a mat. Alternatively, a shrunken coating can also be provided for the formation of the outer layer, in other words that a kind of shrink hose is applied to the cooling hose, which is heated so it contracts and adheres firmly to the inner hose, with the shrink pipe or coating forming the outer layer. Such a coating can be composed, for example, of a cross-linked polyolefin or PVDF.

Finally, a third alternative provides that the outer layer is applied to the then internal cooling component, be it a hose or a cooling film, by means of a separate coating. Such a separately applied coating can be, for example, a gas phase layer composed of one of the above-mentioned materials. However, it is also conceivable to use a paint layer which in a sufficiently high proportion contains one of the above-mentioned materials which does not adhere to the casting compound material.

According to an advantageous development of the invention it is provided that the cooling device, if it is composed of one or more plastic layer(s), is elastic such that it is pressed against the casting compound when the coolant pressure is applied. The cooling device, for example the cooling hose therefore, is designed in such a way in respect of its properties that it still has a certain, optionally also low, elasticity and it expands slightly when the coolant pressure is applied. This sometimes very low expansion particularly advantageously bridges the microscopic separation gap during operation, so there is a flat abutment of the exterior of the cooling device on the interior of the casting compound cavity. The thermal contact can be further improved hereby, but this is very good even with a given separation gap that is only visible with a microscope.

The design of the cooling device in respect of its elasticity should be such that it is composed of one or more materials which have a modulus of elasticity of ≤3,000 MPa, preferably ≤2,000 MPa. The above-mentioned polymeric materials all have moduli of elasticity that are sufficiently low, with a sufficiently low modulus of elasticity resulting even when these materials are combined in the case of a multi-layer cooling device component.

The wall thickness of the cooling device, regardless of the material it is made from or of the structure, should preferably be ≤1 mm, preferably ≤0.75 mm, and regardless of whether the cooling device is a cooling hose with a round or other type of cross-section, for example angular cross-section, or a flat cooling mat.

In addition to the gradient coil the invention further relates to a method for the production of a gradient coil, in which method at least one cooling device is cast in a casting compound, which cures after casting. The method is characterized in that a cooling device made from one material or with a material forming the outer surface is used, which does not enter into an adhesive bond with the cured casting compound.

Expediently, a casting compound made from an epoxy resin, optionally containing at least one filler, with an acid anhydride as a hardener component is used, while a cooling device is used which, at least in the region of its non-adhesive exterior, is composed of a fluorine-containing plastic, in particular PTFE, PVDF or PFA or a silicone or PE or PP.

In a development of the inventive method it can be provided that a cooling device composed of only one material and in the form of a cooling hose or a cooling mat is used, or that a cooling device composed of two or more layers is used, wherein the outer layer forms a non-adhesive outer layer.

In the case of a two- or multi-layer cooling device, expediently one is used which in the case of a cooling device composed only of plastic is either designed in the form of a co-extruded plastic component, or, alternatively, a cooling device with a shrunken coating forming the outer layer or a coating forming the outer layer can also be used. The coating can be a gas phase layer, in particular a fluorine- or silicon-containing carbon layer, or a paint layer or a protective coating.

Furthermore, a cooling device composed of plastic made from one or more elastic materials can be used, which have a modulus of elasticity of ≤3,000 MPa, preferably ≤2,000 MPa. Alternatively or additionally, a cooling device composed of plastic, metal or a combination thereof, which has a wall thickness of ≤1 mm, preferably ≤0.75 mm, can be used.

BRIEF DESCRIPTION OF THE DRAWINGS

Further advantages and details of the present invention emerge from the exemplary embodiments described below as well as with reference to the drawings, in which:

FIG. 4 shows a schematic diagram of a different construction of a hose-shaped cooling device.

DETAILED DESCRIPTION

Figure 1:
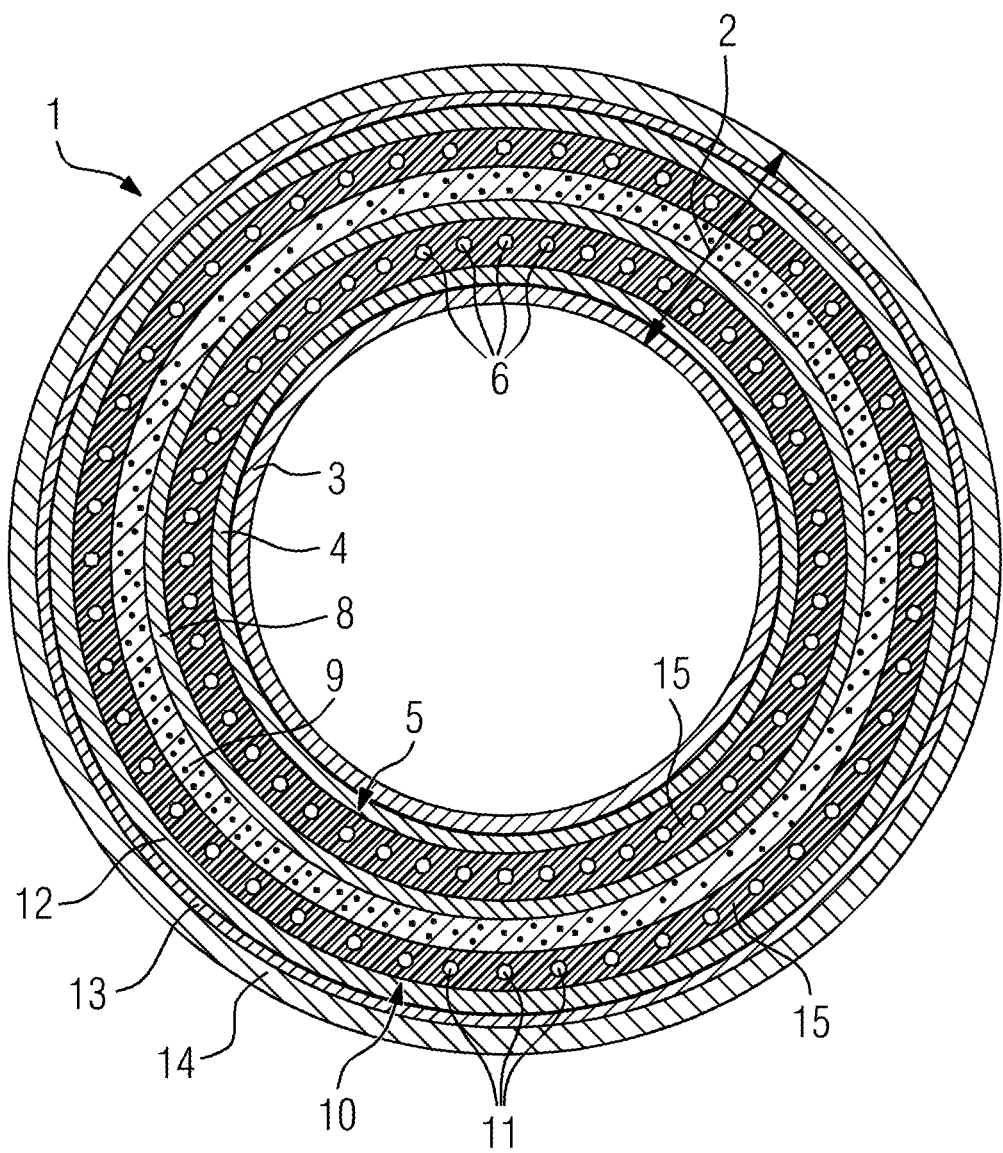
FIG. 1 shows a schematic diagram of an inventive gradient coil in section.

FIG. 1 shows a gradient coil 1, which has a hollow cylindrical structure that is known per se. It has a concentrically arranged layer structure 2, with the individual layers of the layer structure being arranged or mounted from the inside to the outside.

The first, inner layer 3 is built on a generated surface of a cylindrical assembly aid, which is not shown for the sake of clarity. The second layer 4 is then placed on the outer generated surface of the first layer 3 and fixed, etc.

The two inner layers are each gradient coil layers, namely a first gradient coil layer 3 and a second gradient coil layer 4. These are used to generate a transverse gradient magnetic field. For example, these are saddle coils.

A cooling layer with a cooling device 5 adjoins as the next layer. The cooling device 5 is formed by means of cooling lines 6 arranged in a meandering manner on the outer generated surface of the second gradient coil layer, here in the form of round hoses, which serve to dissipate the heat generated by the gradient coil, for which purpose a coolant, usually a water/glycol mixture, circulates due to the cooling device 5 or the cooling lines 6. The cooling lines 6 are appropriately fixed on a plastic carrier, which is placed on the second gradient coil layer 4.

A third gradient coil layer 8 adjoins the first cooling layer for the generation of a longitudinal gradient magnetic field. This coil layer 8 comprises axially arranged gradient coils. Viewed radially outwardly, this third gradient coil layer is followed by what is known as a shim assembly 9. This comprises pocket-shaped cavities (not shown in more detail in the figure) arranged in the axial direction of the gradient coil system for receiving shim elements (also not shown), which are essentially metal strips. Formation and homogenization of a static base magnetic field or main magnetic field is possible by way of these shim elements.

A further second cooling layer, again comprising a cooling device 10, also formed here by corresponding cooling lines 11, radially outwardly adjoins the shim assembly 9. The cooling lines 11 can also be installed in a meandering manner.

Viewed radially outwardly, a fourth gradient coil layer 12 adjoins this second cooling layer for the generation of a longitudinal gradient magnetic field, and a fifth gradient coil layer 13 and a sixth gradient coil layer 14 for the generation of transverse gradient magnet fields. The three outer gradient coil layers 12, 13 and 14 are structured in principle similar to the inner gradient coil layers 3, 4 and 8, but they are designed to shield scatter fields outside the gradient coil system and ensure that a gradient magnetic field is only present inside the gradient coil system.

After the assembly of all layers of the gradient coil 1, the gaps are filled with a casting compound 15, usually an epoxy resin with an acid anhydride as a hardener component, with the epoxy resin conventionally containing a filler in the form of quartz powder. All components are embedded in this casting compound, in particular the cooling lines 6 and 11 of the cooling devices 5 and 10. These are therefore embedded in the casting compound 15 on all sides, which otherwise also completely embeds all gradient coils, etc. This is made possible since, viewed radially, the individual layers of the entire layer system communicate with each other via corresponding passages, so the casting compound introduced on one side leads both axially and radially to complete, cavity- or shrink-hole-free embedding of all components and in particular of cooling lines 6 and 11.

According to the invention, the material pairing of casting compound 15 and the material of a cooling line 6 (the same applies of course to the cooling line 11) is chosen in such a way that the casting compound 15 introduced in fluid form and which cures only subsequently does not wet the cooling line 6, in other words that neither enter into an adhesive bond, the cooling line 6 does not adhere to the casting compound 15 or vice versa in the cured system therefore. This situation is shown in an enlarged schematic diagram in FIG. 2. This shows a detail of the first cooling plane with the cooling device 5 and the casting compound 15. The cooling line 6 is composed in this case of only one material, for example a fluorine-containing plastic such as PTFE, PVDF or PFA. Alternatively, it can also be composed of silicone, PE or PP. The casting compound 15 is composed, as described, of a preferably quartz powder as the filler-containing epoxy resin with an acid anhydride as a hardener. In the cured state shown in FIG. 2, due to non-adhesion of the cooling line 6 to the casting compound 15, a gap 16 that can only be detected with a microscope forms between the exterior 17 of the cooling line and the inner wall 18 of the cavity of the casting compound 15. This gap (shown overly large in FIG. 2 for the sake of clarity) is only a few micrometers wide, but it nevertheless causes a mechanical decoupling of the casting compound 15 from the cooling line 6. The result of this is that, should a crack 19 occur in the casting compound during operation owing to the given mechanical stresses, resulting from vibrations, Lorentz forces and thermal heating cycles, as shown by way of example in FIG. 2, this crack 19 spreads in the casting compound 15, but its growth stops at the transition of the casting compound 15 to the gap 16, therefore the crack growth due to the lack of mechanical coupling of the casting compound 15 to the cooling line 6 ends there or the crack 19 is passed around the cooling line 6 and possibly continues at a different position. In any case, owing to the absence of mechanical coupling or the separation of the casting compound 15 and cooling line 6, an encroachment of the crack or entry of mechanical stresses into the cooling line 6 is ruled out, so, despite the crack occurring in the casting compound 15, the cooling line itself is not affected, in other words is not under stress and therefore cannot be torn open either. Despite cracking in the casting compound 15, crack-related damage to the cooling system and therewith a possible leakage is thereby advantageously avoided.

The cooling line 6 preferably has a low wall thickness, the wall thickness should be ≤1 mm, preferably ≤0.75 mm.

Expediently, the cooling line 6, the same applies as described also to the cooling line 11, is composed of a material having a certain elasticity. The modulus of elasticity of the material should be ≤3,000 MPa, preferably ≤2,000 MPa. This low elasticity leads to the cooling line 6 having a slight widening, being minimally expanded therefore, at a sufficiently high applied pressure of the coolant 20, which is shown by way of example in FIG. 3. The expansion is so large that the gap 16 is closed or bridged and the exterior 17 of the cooling line 6 rests on the inside of the wall 18 of the cavity in the casting compound 15. This further improves thermal coupling, which is very good for a high heat dissipation rate even with a microscopically narrow gap 16.

Figure 2:
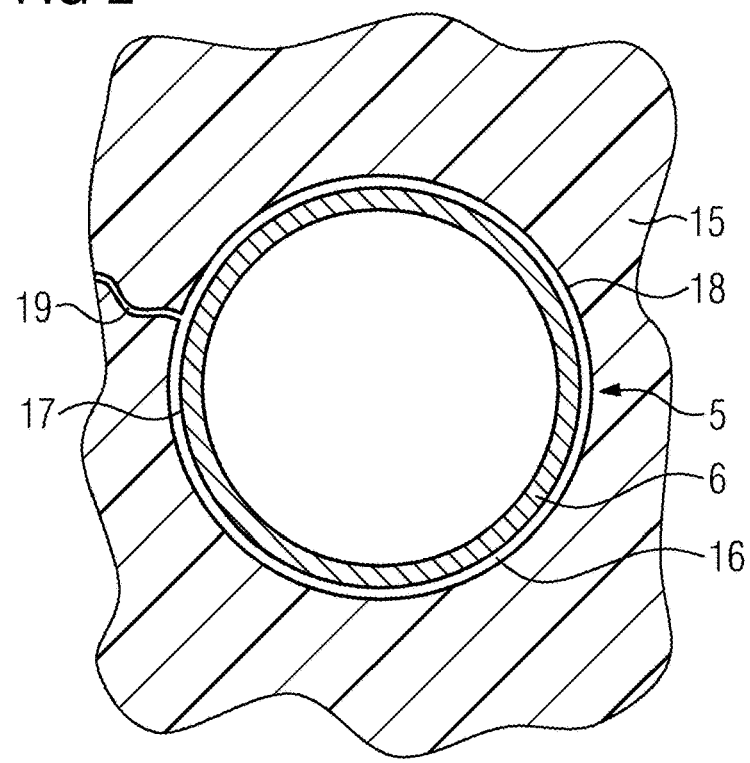
FIG. 2 shows an enlarged partial view of the gradient coil of FIG. 1, showing a cooling device integrated in the form of a hose in a casting compound after cured casting.
Figure 3:
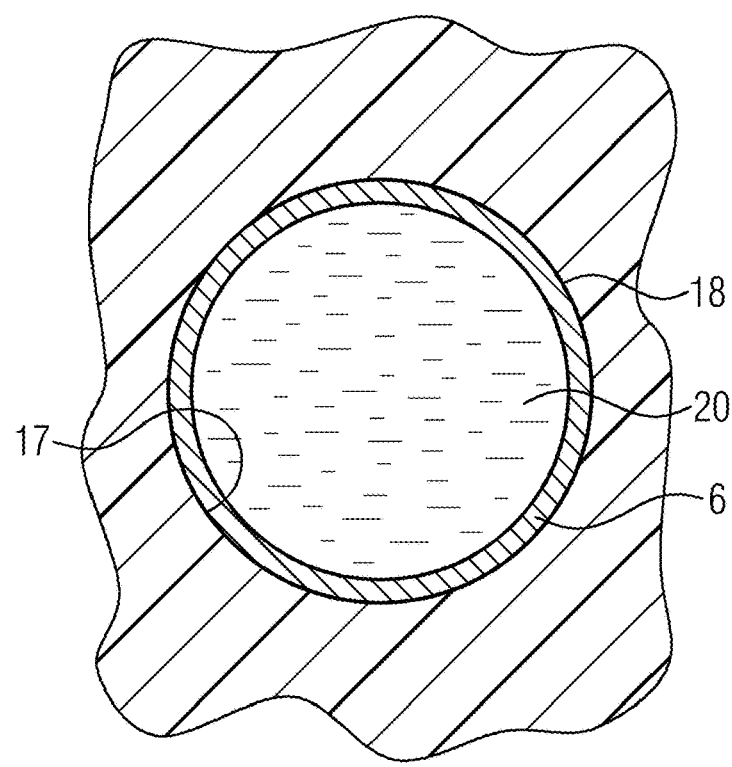
FIG. 3 shows the view of FIG. 2 during operation.

The exemplary embodiment according to FIGS. 2 and 3 describes a cooling line 6 in the form of a hose with a round cross-section. In addition to the fact that the cooling line 6 (the same applies of course to the cooling line 11) can have a different, for example angular, cross-section, the cooling line 6 can also be designed as a multi-layer component, for example as a coextrusion plastic component or as a coated component. FIG. 4 shows an example of this. The cooling line 6 shown here by way of example is composed of an outer layer 21 and an inner layer 22. The outer layer 21 is composed of one of the above-described materials, which does not enter into an adhesive bond with the casting compound, with the fluorine-containing plastic, silicone or the like. The inner layer 22, on the other hand, can be composed of a material which is particularly stable or resistant, for example in respect of the coolant used, and is therefore optimized in respect of the medium conducted in the cooling line 6. However, the material of both layer materials is again chosen such that preferably sufficient elasticity is given as described above.

While in the above described exemplary embodiments cooling lines 6 and 11 respectively in the form of cooling hoses are provided and installed as the cooling devices 5 or 10, it is alternatively possible to install cooling mats as the cooling devices 5 or 10 instead of the cooling hoses. These are composed of plastic films placed on top of each other, which are locally connected to each other and which have perforations or through openings, viewed over the surface, in order to allow a passage of the casting compound in the radial direction for the purpose of embedding. The films of such a cooling mat are now also inventively composed of a material that does not enter into an adhesive bond with the casting material 15. The layer structure of such a gradient coil is similar to that as shown and described in FIG. 1, differing only in the fact that no cooling lines 6 or 11 are installed, but instead the corresponding larger-area mats are arranged on the cylindrical circumferential surface and are then cast with the entire layer structure. Again, there is no wetting here either and therefore no adhesion of the casting compound and cooling device, so in this case too a crack growth owing to the lack of mechanical coupling and the stress reduction that occurs in the casting compound alone cannot encroach on the cooling device and lead to damage thereof.

Although the invention has been illustrated and described in detail by the preferred exemplary embodiment, it is not limited by the disclosed examples and a person skilled in the art can derive other variations herefrom without departing from the scope of protection for the invention.

The invention claimed is:

1. A gradient coil, comprising a coil body made from a cured casting compound and at least one cooler embedded in the casting compound, wherein the cooler is configured to conduct a fluid coolant and comprises only one material layer of two or more layers with a non-adhesive outer layer such that the cooler and the casting compound do not adhere to each other.

2. A method for the production of a gradient coil comprising a coil body made from a cured casting compound and at least one cooler embedded in the casting compound, wherein the cooler is configured to conduct a fluid coolant, the method comprising:
casting the at least one cooler in the casting compound which cures after casting, the at least one cooler comprising only one material layer of two or more layers with a non-adhesive outer layer such that the cooler and the casting compound do not adhere to each other.

3. The gradient coil as claimed in claim 1, wherein the casting compound comprises an epoxy resin with an acid anhydride as a hardener component, and wherein the cooler, at least in the region of its non-adhesive exterior, comprises a fluorine-containing plastic or metal.

4. The gradient coil as claimed in claim 3, wherein the epoxy resin comprises at least one filler, and the fluorine-containing plastic comprises PTFE, PVDF, PFA, a silicone, PE, or PP, and the metal comprises copper, brass or aluminum.

5. The gradient coil as claimed in claim 1, wherein the two- or multi-layer cooler is a co-extruded plastic component, or the outer layer is a coating or a shrunken coating.

6. The gradient coil as claimed in claim 5, wherein the coating is a gas phase layer or a paint layer.

7. The gradient coil as claimed in claim 5, wherein the shrunken coating comprises a crosslinked polyolefin or PVDF.

8. The gradient coil as claimed in claim 1, wherein the cooler is elastic such that it is pressed against the casting compound when coolant pressure is applied.

9. The gradient coil as claimed in claim 8, wherein the cooler comprises one or more materials, which have a modulus of elasticity of ≤3,000 MPa.

10. The gradient coil as claimed in claim 9, wherein the one or more materials have a modulus of elasticity of ≤2,000 Mpa.

11. The gradient coil as claimed in claim 1, wherein the cooler has a wall thickness of ≤1 mm.

12. The gradient coil as claimed in claim 1, wherein the cooler has a wall thickness of ≤0.75 mm.

13. The gradient coil as claimed in claim 1, wherein the cooler is designed in the form of one or more cooling hoses or one or more flat cooling mats.

14. The method as claimed in claim 2, wherein the casting compound is made from an epoxy resin with an acid anhydride used as a hardener component, and the cooler comprises, at least in the region of its non-adhesive exterior, a fluorine-containing plastic.

15. The method as claimed in claim 2, wherein the cooler is a two- or multi-layer cooler in the form of a co-extruded plastic component, or comprises a coating or a shrunken coating forming the outer layer.

16. The method as claimed in claim 2, wherein the cooler comprises one or more elastic materials, which have a modulus of elasticity of ≤3,000 MPa, or the cooler has a wall thickness of ≤1 mm.

\* \* \* \* \*